US012627019B2

(12) United States Patent  (10) Patent No.: US 12,627,019 B2
Nihei  (45) Date of Patent: May 12, 2026

(54) FILTER DEVICE AND RADIO-FREQUENCY FRONT-END CIRCUIT EQUIPPED WITH THE SAME

(71) Applicant: Murata Manufacturing Co., Ltd., Nagaokakyo (JP)

(72) Inventor: Takashi Nihei, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 189 days.

(21) Appl. No.: 18/378,167

(22) Filed: Oct. 10, 2023

(65) Prior Publication Data

US 2024/0039136 A1 Feb. 1, 2024

Related U.S. Application Data

(63) Continuation of application No. PCT/JP2022/004299, filed on Feb. 3, 2022.

(30) Foreign Application Priority Data

Apr. 26, 2021 (JP) ................................. 2021-074257

(51) Int. Cl.
| | |
|---|---|
| *H03H 7/09* | (2006.01) |
| *H01P 1/203* | (2006.01) |
| *H01P 1/205* | (2006.01) |
| *H03H 7/01* | (2006.01) |
| *H03H 1/00* | (2006.01) |

(52) U.S. Cl.
CPC .......... *H01P 1/20345* (2013.01); *H01P 1/205* (2013.01); *H03H 7/0115* (2013.01); *H03H 7/09* (2013.01); *H03H 2001/0085* (2013.01)

(58) Field of Classification Search
CPC .......... H03H 2001/0085; H03H 7/0115; H01P 1/20345
USPC .................................. 333/175, 185, 202–205
See application file for complete search history.

(56) References Cited

U.S. PATENT DOCUMENTS

| | | | | | |
|---|---|---|---|---|---|
| 5,608,364 | A | * | 3/1997 | Hirai | H01P 1/20345 |
| | | | | | 333/204 |
| 5,614,328 | A | * | 3/1997 | Suzuki | C25D 5/505 |
| | | | | | 379/912 |
| 8,378,763 | B2 | * | 2/2013 | Wakata | H03H 7/1775 |
| | | | | | 333/204 |

(Continued)

FOREIGN PATENT DOCUMENTS

| | | |
|---|---|---|
| JP | 0440701 A | 2/1992 |
| JP | 05267907 A | 10/1993 |

(Continued)

OTHER PUBLICATIONS

International Search Report in PCT/JP2022/004299, mailed Apr. 19, 2022, 3 pages.

(Continued)

*Primary Examiner* — Rakesh B Patel
(74) *Attorney, Agent, or Firm* — Keating & Bennett, LLP

(57) ABSTRACT

A filter device includes an input terminal, an output terminal, a shield conductor, and a resonant circuit including at least one resonator, and inductors. A first inductor connects the input terminal and the shield conductor. A second inductor connects the output terminal and the shield conductor. The input terminal and the output terminal are capacitively coupled to the resonant circuit.

19 Claims, 4 Drawing Sheets

(56)     References Cited

U.S. PATENT DOCUMENTS

2010/0225414 A1 *   9/2010   Gorbachov .......... H04B 7/0817
                                                    333/101
2017/0026064 A1 *   1/2017   Khlat ........................ H03F 3/24

FOREIGN PATENT DOCUMENTS

JP          2003218604 A     7/2003
JP          2007235465 A     9/2007

OTHER PUBLICATIONS

Written Opinion in PCT/JP2022/004299, mailed Apr. 19, 2022, 4 pages.

* cited by examiner

FILTER DEVICE AND RADIO-FREQUENCY FRONT-END CIRCUIT EQUIPPED WITH THE SAME

CROSS REFERENCE TO RELATED APPLICATIONS

This application claims the benefit of priority to Japanese Patent Application No. 2021-074257 filed on Apr. 26, 2021 and is a Continuation Application of PCT Application No. PCT/JP2022/004299 filed on Feb. 3, 2022. The entire contents of each application are hereby incorporated herein by reference.

BACKGROUND OF THE INVENTION

1. Field of the Invention

The present disclosure relates to a filter device and a radio-frequency front-end circuit including the filter device, and, more particularly, to techniques to protect an input terminal and an output terminal of the filter device.

2. Description of the Related Art

Japanese Unexamined Patent Application Publication No. 2007-235465 discloses a bandpass filter including a laminated dielectric resonator obtained by laminating a plurality of inner electrode layers in a dielectric. In the bandpass filter disclosed in Japanese Unexamined Patent Application Publication No. 2007-235465, an inductor portion of the inner electrode layers is formed by a long pattern having a shape in which the width of the long pattern partly gradually narrows. Since this configuration achieves the decrease in a resonant frequency without the decrease in a Q value, a resonator can be miniaturized.

SUMMARY OF THE INVENTION

In the filter device disclosed in Japanese Unexamined Patent Application Publication No. 2007-235465, a radio-frequency signal input to an input terminal passes through a filter portion (resonant circuit) formed by the resonator and is output from an output terminal. At that time, the case may arise where the input terminal and the output terminal are capacitively coupled to the filter portion.

The above input terminal and the above output terminal function as connection terminals for the connection to an external device and are electrically connected to an external device by, for example, soldering. An input terminal and an output terminal are typically formed with Cu or Ag, but the surfaces of an input terminal and an output terminal may be covered with a metal with high corrosion resistance such as Au or Sn for preventing, for example, a soldering erosion.

A metal with high corrosion resistance such as Au or Sn is generally formed by electrolytic plating after a filter device has been formed. However, in the case where the input terminal and the output terminal are capacitively coupled to the filter portion as described above, the input terminal and the output terminal are not connected to a grounding terminal and are in an electrically floating state (insulated state). A current therefore does not flow through the input terminal and the output terminal. As a result, the input terminal and the output terminal may be insufficiently covered with a metal with high corrosion resistance.

Preferred embodiments of the present invention cover, in a filter device in which an input terminal and an output terminal are capacitively coupled to a resonant circuit, the input terminal and the output terminal with a metal with high corrosion resistance. A filter device according to a preferred embodiment of the present disclosure includes an input terminal, an output terminal, a grounding terminal, a resonant circuit including at least one resonator, a first inductor, and a second inductor. The first inductor is structured to connect the input terminal and the grounding terminal. The second inductor is structured to connect the output terminal and the grounding terminal. The input terminal and the output terminal are capacitively coupled to the resonant circuit.

In a filter device according to a preferred embodiment of the present disclosure, an input terminal and an output terminal that are capacitively coupled to a resonant circuit are connected to a grounding terminal via corresponding inductors. Since the input terminal and the output terminal are not in an electrically insulated state, the input terminal and the output terminal can be covered with a metal with high corrosion resistance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
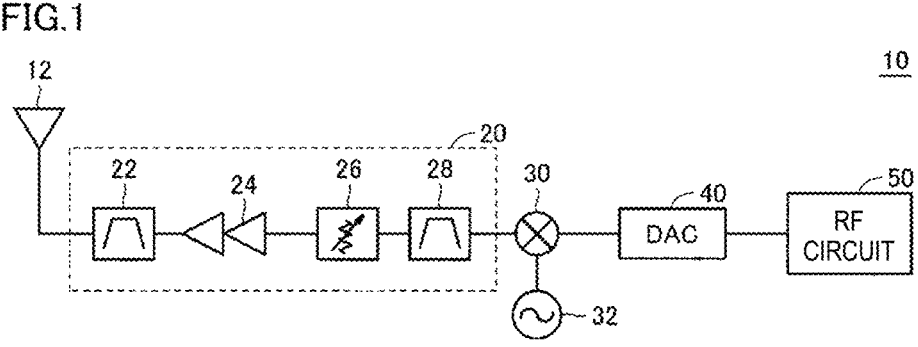
FIG. 1 is a block diagram of a communication device including a radio-frequency front-end circuit to which a filter device according to a preferred embodiment of the present invention is applied.

Preferred embodiments of the present disclosure will be described in detail below with reference to drawings. The same reference numeral is used to represent the same element or portion or the corresponding element or portion in the drawings, and the description thereof will not be repeated.

Basic Configuration of Communication Device

FIG. 1 is a block diagram of a communication device 10 including a radio-frequency front-end circuit 20 to which a filter device according to the present preferred embodiment is applied. The communication device 10 is, for example, a mobile terminal, most notably a smartphone, or a base station for mobile phones.

Referring to FIG. 1, the communication device 10 includes an antenna 12, the radio-frequency front-end circuit 20, a mixer 30, a local oscillator 32, a D/A converter (DAC) 40, and an RF circuit 50. The radio-frequency front-end circuit 20 includes bandpass filters 22 and 28, an amplifier 24, and an attenuator 26. The case will be described with reference to FIG. 1 where the radio-frequency front-end circuit 20 includes a transmission circuit to transmit a radio-frequency signal from the antenna 12, but the radio-frequency front-end circuit 20 may include a reception circuit to receive a radio-frequency signal via the antenna 12.

The communication device 10 up-converts a signal transmitted from the RF circuit 50 into a radio-frequency signal and emits the radio-frequency signal from the antenna 12 as a transmission signal. A modulated digital signal output from the RF circuit 50 is converted into an analog signal by the D/A converter 40. The mixer 30 mixes the analog signal converted by the D/A converter 40 with an oscillation signal from the local oscillator 32 and up-converts the signal into a radio-frequency signal. The bandpass filter 28 removes an unwanted wave generated at the time of up-conversion and extracts only a signal in a desired frequency band. The attenuator 26 adjusts the strength of the signal. The amplifier 24 amplifies the power of the signal that has passed through the attenuator 26 to a predetermined level. The bandpass filter 22 removes an unwanted wave generated in the process of amplification and passes only a signal component in a frequency band determined by a communication standard. A signal that has passed through the bandpass filter 22 is emitted from the antenna 12 as a communication signal.

As the bandpass filters 22 and 28 in the above communication device 10, a filter device according to a preferred embodiment of the present disclosure can be applied.

Configuration of Filter Device

Next, the detailed configuration of a filter device 100 according to the present preferred embodiment will be described with reference to FIGS. 2 to 5. The filter device 100 will be described in the present preferred embodiment as being a dielectric filter including a plurality of resonators that are distributed constant elements, but may be another type of filter, such as a filter including an inductor and a capacitor.

Figure 2:
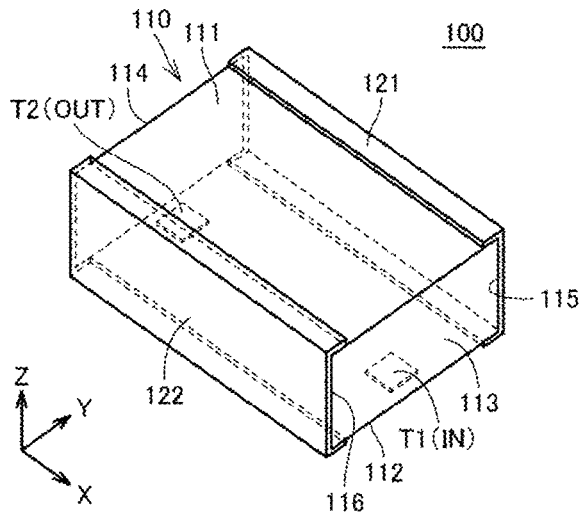
FIG. 2 is an external perspective view of a filter device according to a preferred embodiment of the present invention.
Figure 3:
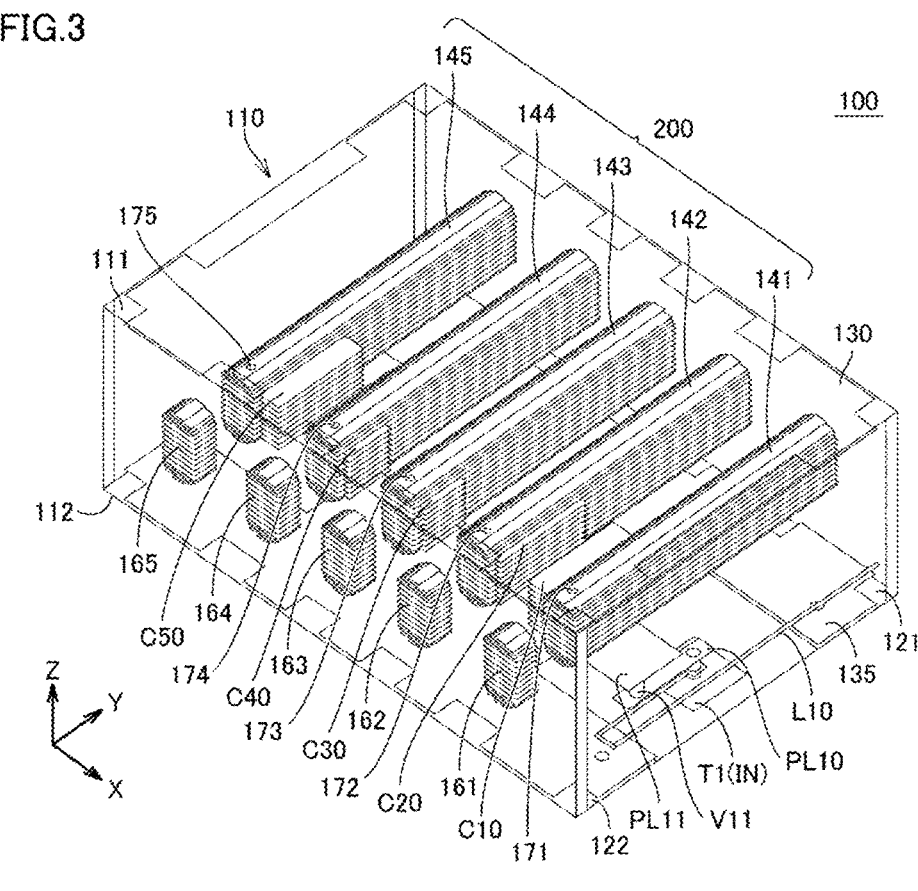
FIG. 3 is a transparent perspective view of a filter device according to a preferred embodiment of the present invention which illustrates the internal configuration of the filter device.
Figure 4:
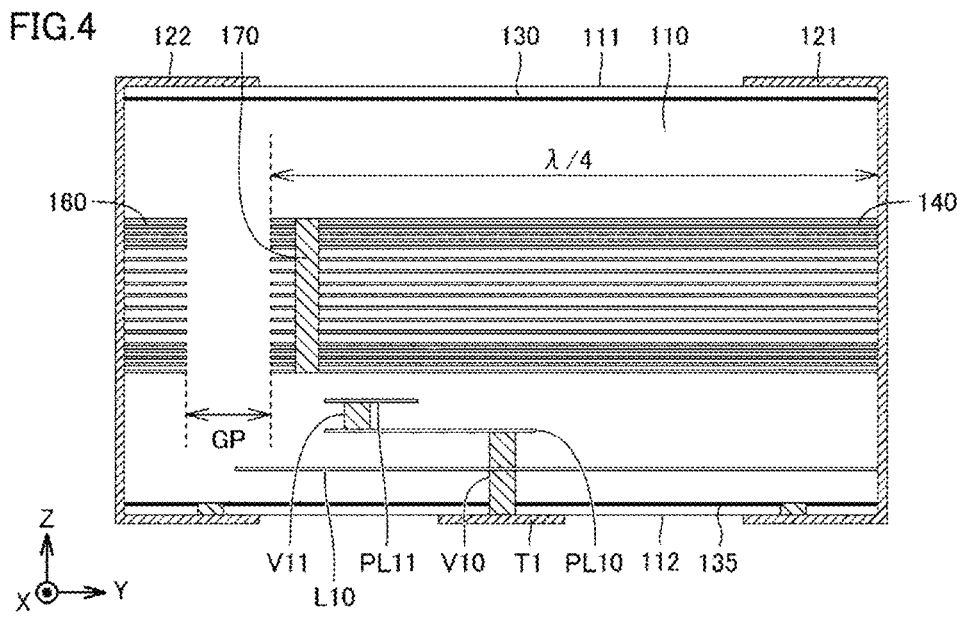
FIG. 4 is a cross-sectional view of a filter device according to a preferred embodiment of the present invention.
Figure 5:
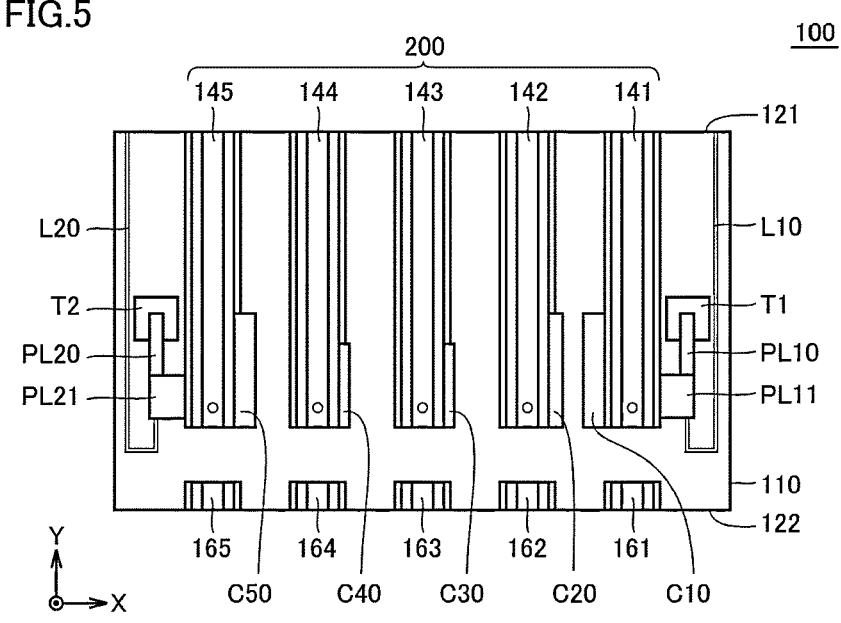
FIG. 5 is a plan view of a filter device according to a preferred embodiment of the present invention.

FIG. 2 is an external perspective view of the filter device 100. FIG. 2 illustrates only the configuration that can be viewed from the outer surface of the filter device 100, and the illustration of an internal configuration is omitted. FIG. 3 is a transparent perspective view of the filter device 100 which illustrates the internal configuration of the filter device 100. FIG. 4 is a cross-sectional view of the filter device 100. FIG. 5 is a plan view of the filter device 100 viewed from a lamination direction.

Referring to FIG. 2, the filter device 100 includes a rectangular parallelepiped or substantially rectangular parallelepiped multilayer body 110 in which a plurality of dielectric layers are laminated in a predetermined direction. The multilayer body 110 includes a top surface 111, a bottom surface 112, a side surface 113, a side surface 114, a side surface 115, and a side surface 116. The side surface 113 is located in the positive direction along the X axis, and the side surface 114 is located in the negative direction along the X axis. The side surfaces 115 and 116 are perpendicular to the Y-axis direction. FIG. 4 is a cross-sectional view of a resonator included in the filter device 100 viewed from the X-axis direction.

Each dielectric layer in the multilayer body 110 is made of ceramic such as low-temperature co-fired ceramic (LTCC) or a resin. In the multilayer body 110, distributed constant elements defining resonators, capacitors to connect the distributed constant elements, and inductors to connect the distributed constant elements include a plurality of flat conductors provided in the dielectric layers and a plurality of vias between the dielectric layers. In the present specification, a "via" represents a conductor that connects conductors provided in different dielectric layers and extends in the lamination direction of dielectric layers. A via is formed by, for example, conductive paste, plating, and/or a metal pin.

In the following description, a lamination direction of dielectric layers in the multilayer body 110 is defined as a "Z-axis direction", a direction that is perpendicular to the Z-axis direction and is along the long sides of the multilayer body 110 is defined as an "X-axis direction" (a second direction), and a direction along the short sides of the multilayer body 110 is defined as a "Y-axis direction" (a first direction). A positive direction and a negative direction of the Z-axis in the drawings are hereinafter referred to as an upper side and a lower side, respectively in some cases.

As illustrated in FIG. 2, the filter device 100 includes a shield conductor 121 covering the side surface 115 of the multilayer body 110 and a shield conductor 122 covering the side surface 116 of the multilayer body 110. Each of the shield conductors 121 and 122 has a substantially C-letter shape when viewed from the X-axis direction of the multilayer body 110. That is, the shield conductors 121 and 122 partly covers the top surface 111 and the bottom surface 112 of the multilayer body 110. A portion of the bottom surface 112 of the multilayer body 110 covered by the shield conductors 121 and 122 is connected to a grounding electrode on a mount board (not illustrated) via a connector such as a solder bump. That is, the shield conductors 121 and 122 also function as grounding terminals.

The filter device 100 includes an input terminal T1 and an output terminal T2 provided on the bottom surface 112 of the multilayer body 110. The input terminal T1 is disposed at a position near the side surface 113 in the positive direction along the X axis on the bottom surface 112. The output terminal T2 is disposed at a position near the side surface 114 in the negative direction along the X axis on the bottom surface 112. The input terminal T1 and the output terminal T2 are electrically connected to corresponding electrodes on the mount board via connectors such as solder bumps. The input terminal T1 and the output terminal T2 are terminals used for the input and output of signals. The input-output relationship may be reversed.

Next, the internal configuration of the filter device 100 will be described with reference to FIG. 3. The filter device 100 further includes flat electrodes 130 and 135, a plurality of resonators 141 to 145, capacitor electrodes 161 to 165, connection conductors 171 to 175, and inductors L10 and L20 in addition to the configuration illustrated in FIG. 2. In the following description, the resonators 141 to 145, the capacitor electrodes 161 to 165, and the connection conductors 171 to 175 are collectively referred to as a "resonator 140", a "capacitor electrode 160", and a "connection conductor 170", respectively in some cases.

The flat electrodes 130 and 135 are disposed to face each other at respective positions which are spaced apart from each other in the lamination direction (the Z-axis direction) in the multilayer body 110. The flat electrode 130 is disposed in a dielectric layer near the top surface 111 and is connected to the shield conductors 121 and 122 at the end portions thereof in the Y-axis direction. The flat electrode 130 has a shape almost covering the dielectric layer when viewed in plan from the lamination direction.

The flat electrode 135 is disposed in a dielectric layer near the bottom surface 112 of the multilayer body 110. The flat electrode 135 has a substantially H-letter shape in which a cutout portion is formed in portions facing the input terminal T1 and the output terminal T2 when viewed in plan from the lamination direction. The flat electrode 135 is connected to the shield conductors 121 and 122 at the end portions thereof in the Y-axis direction.

In the multilayer body 110, the resonators 141 to 145 are disposed between the flat electrodes 130 and 135. Each of the resonators 141 to 145 extends in the Y-axis direction (first direction). Respective end portions (first end portions) of the resonators 141 to 145 in the positive direction along the Y axis are connected to the shield conductor 121. Respective end portions (second end portions) of the resonators 141 to 145 in the negative direction along the Y axis are spaced apart from the shield conductor 122. The resonators 141 to 145 define a "resonant circuit 200".

The resonators 141 to 145 are arranged in the X-axis direction (second direction) in the multilayer body 110 in the filter device 100. More specifically, the resonators 141, 142, 143, 144, and 145 are arranged in this order from the positive direction to the negative direction along the X axis.

Each of the resonators 141 to 145 includes a plurality of conductors disposed along the lamination direction. The multiple conductors are substantially elliptical in cross section of the resonator 140 parallel to the ZX plane (i.e., cross section viewed in plan from the Y-axis direction). That is, the dimension of the conductors disposed in the uppermost layer and the lowermost layer in the X-axis direction is narrower than that of the conductors disposed in the middle layers.

The multiple conductors included in each of the resonators 140 are electrically connected to each other by the connection conductor 170 at a position near the second end portion on the shield conductor 122 side. The length of each resonator in the Y-axis direction is approximately λ/4, for example, where λ represents the wavelength of a transmitted radio-frequency signal. The resonator 140 functions as a distributed-constant TEM mode resonator including the multiple conductors as center conductors and the flat electrodes 130 and 135 as outer conductors.

The input terminal T1 is connected to one end of a flat electrode PL10 via a via V10. The flat electrode PL10 is rectangular in shape and extends in the negative direction along the Y axis from the via V10. A via V11 is connected to the other end of the flat electrode PL10. The flat electrode PL10 is connected to a flat electrode PL11 via the via V11. The flat electrode PL11 is rectangular in shape and faces the bottom surface of the resonator 141. That is, the input terminal T1 is capacitively coupled to the resonator 141 in the resonant circuit 200.

The output terminal T2 is connected to flat electrodes PL20 and PL21 via vias like the input terminal T1. The flat electrode PL21 is rectangular in shape and faces the bottom surface of the resonator 145. That is, the output terminal T2 is capacitively coupled to the resonator 145 in the resonant circuit 200.

The inductor L10 is connected to the via V10 connected to the input terminal T1. The inductor L10 extends in the negative direction along the Y axis from the via V10, turns back before reaching the shield conductor 122, and extends in the positive direction along the Y axis to connect to the shield conductor 121. As illustrated in FIG. 5, it is desired that the inductor L10 be disposed at a position not overlapping the resonant circuit 200 when viewed in plan from the lamination direction (Z-axis direction) of the multilayer body 110.

The output terminal T2 is similarly connected to the shield conductor 121 by the inductor L20. It is desired that the inductor L20 not overlap the resonant circuit 200 when viewed in plan from the lamination direction of the multilayer body 110.

The resonators 141 to 145 are magnetically coupled to each other, and a radio-frequency signal input to the input terminal T1 is transmitted to the resonators 141 to 145 in this order and is then output from the output terminal T2. At that time, the filter device 100 functions as a bandpass filter by the use of the degree of coupling between the resonators.

A protruding capacitor electrode is provided between the second end portion side of the resonator 140 and an adjacent resonator. The capacitor electrode has a structure in which the multiple conductors included in the resonator partly protrude. The degree of capacitive coupling between resonators can be adjusted by changing the length of a capacitor electrode in the Y-axis direction, the distance between capacitor electrode and an adjacent resonator, and/or the number of conductors included in the capacitor electrode.

In the filter device 100, a capacitor electrode C10 protruding from the resonator 141 to the resonator 142 and a capacitor electrode C20 protruding from the resonator 142 to the resonator 141 are provided as illustrated in FIG. 3. In addition, a capacitor electrode C30 protruding from the resonator 143 to the resonator 142 and a capacitor electrode C40 protruding from the resonator 144 to the resonator 143 are provided. In addition, a capacitor electrode C50 protruding from the resonator 145 to the resonator 144 is provided.

The capacitor electrodes C10 to C50 are not essential configurations, and some or all of the capacitor electrodes do not necessarily have to be provided on condition that the desired degree of coupling between resonators can be obtained. In addition to the configuration illustrated in FIG. 3, the filter device may include a capacitor electrode protruding from the resonator 142 to the resonator 143, a capacitor electrode protruding from the resonator 143 to the resonator 144, and a capacitor electrode protruding from the resonator 144 to the resonator 145.

In the filter device 100, the capacitor electrode 160 is disposed to face the second end portion of the resonator 140. The cross section of the capacitor electrode 160 parallel to the ZX plane is similar to that of the resonator 140. The capacitor electrode 160 is connected to the shield conductor 122. The resonator 140 and the corresponding capacitor electrode 160 therefore defines a capacitor. The capacitance of a capacitor including the resonator 140 and the corresponding capacitor electrode 160 can be adjusted by changing a gap (distance in the Y-axis direction) GP between the resonator and the capacitor electrode illustrated in FIG. 4.

In the filter device 100 described above, the input terminal T1 and the output terminal T2 function as connection terminals for the connection to an external device and are electrically connected to an external device by, for example, soldering. The input terminal T1 and the output terminal T2 are typically formed with Cu or Ag, but the surfaces of the input terminal T1 and the output terminal T2 may be covered with a metal with high corrosion resistance such as Au or Sn to prevent, for example, a soldering erosion.

A metal with high corrosion resistance is generally formed by electrolytic plating after a filter device has been formed. However, in the case where the input terminal T1 and the output terminal T2 are capacitively coupled to the respective resonant circuits as described above, the input terminal T1 and the output terminal T2 are in an insulated state when the input terminal T1 and the output terminal T2 are not connected to a grounding terminal. Accordingly, the input terminal T1 and the output terminal T2 may be insufficiently covered with a metal with high corrosion resistance.

In the filter device 100 according to a preferred embodiment of the present disclosure, the input terminal T1 and the output terminal T2 are connected to the shield conductor 121 functioning as a grounding terminal via the inductors L10 and L20, respectively. When electrolytic plating is performed for the formation of metal with high corrosion resistance, a current can therefore flow through the input terminal T1 and the output terminal T2 via the shield conductor 121 because the input terminal T1 and the output terminal T2 are prevented from being in an insulated state. Accordingly, the input terminal T1 and the output terminal T2 can be covered with a metal with high corrosion resistance.

A setting is performed in accordance with a frequency and desired filter characteristics. In the filter device 100 according to the present preferred embodiment, the inductances of the inductors L10 and L20 are greater than or equal to about 5 nH, for example.

Figure 6:
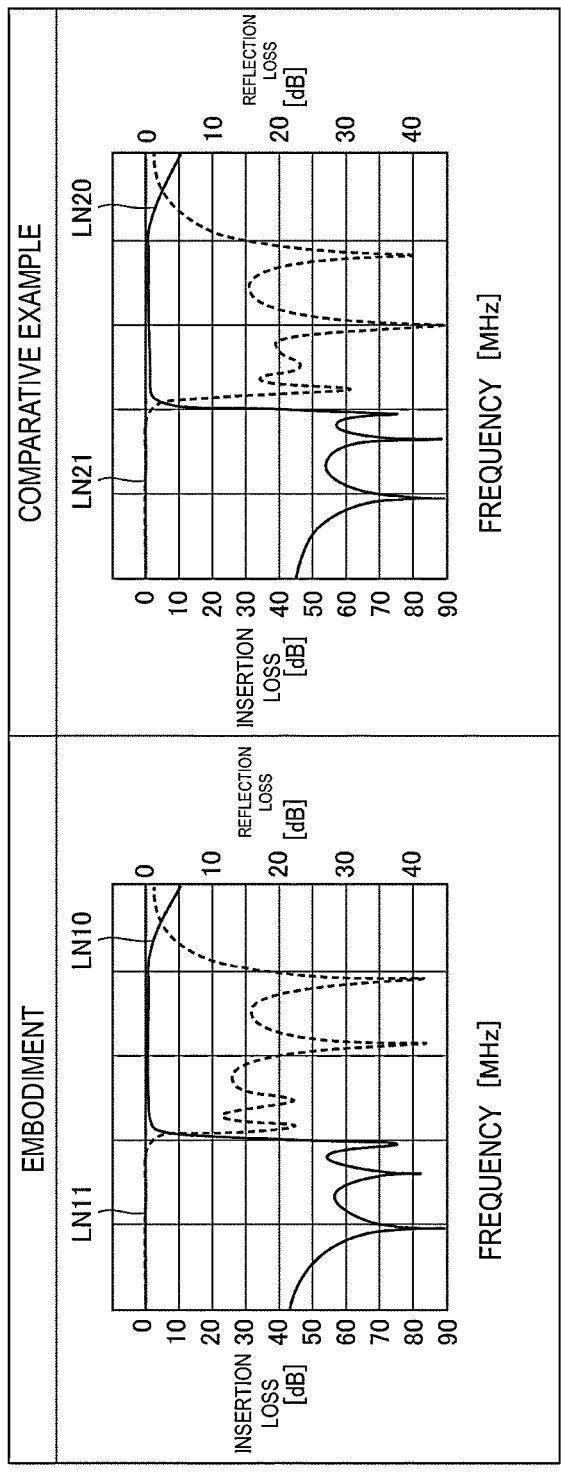
FIG. 6 is a diagram describing the filter characteristics of a filter device according to a preferred embodiment of the present invention.

FIG. 6 is a graph indicating the filter characteristics of the filter device 100 according to the present preferred embodiment and the filter characteristics of a comparative example not including the inductors L10 and L20. Referring to FIG. 6, the horizontal axis represents frequency and the vertical axis represents an insertion loss (solid lines LN10 and LN20) and a reflection loss (broken lines LN11 and LN21).

As illustrated in FIG. 6, even in the configuration of the filter device 100 including the inductors L10 and L20, bandpass characteristics equivalent to those of a comparative example can be achieved by appropriately setting the inductances of the inductors L10 and L20.

Thus, even in the configuration in which an input terminal and an output terminal are capacitively coupled to resonant circuits, the effect upon the bandpass characteristics of a filter device can be reduced or prevented and the input terminal and the output terminal can be covered with a metal with high corrosion resistance by connecting the input terminal and the output terminal to a grounding terminal via inductors having respective appropriate inductances.

The "inductor L10" and the "inductor L20" according to the present preferred embodiment correspond to a "first inductor" and a "second inductor", respectively. The "flat electrode 130" and the "flat electrode 135" according to the present preferred embodiment correspond to a "first flat electrode" and a "second flat electrode", respectively. The "shield conductor 121" and the "shield conductor 122" according to the present disclosure correspond to a "first shield conductor" and a "second shield conductor", respectively. The "side surface 115" and the "side surface 116" according to the present preferred embodiment correspond to a "first side surface" and a "second side surface", respectively.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a multilayer body including a plurality of dielectric layers;
an input terminal;
an output terminal;
a grounding terminal;
a resonant circuit including a plurality of resonators;

a first inductor that conductively connects the input terminal to the grounding terminal;
a second inductor that conductively connects the output terminal to the grounding terminal;
a first flat electrode and a second flat electrode spaced apart from each other in a lamination direction in the multilayer body; and
a first shield conductor and a second shield conductor that are connected to the grounding terminal; wherein
the resonant circuit is between the first flat electrode and the second flat electrode and includes the plurality of resonators extending in a first direction perpendicular or substantially perpendicular to the lamination direction;
the first shield conductor and the second shield conductor are on a first side surface and a second side surface of the multilayer body, respectively, which are perpendicular to the first direction and are connected to the first flat electrode and the second flat electrode;
the plurality of resonators are arranged in the multilayer body in a second direction perpendicular or substantially perpendicular to both the lamination direction and the first direction;
respective first end portions of the plurality of resonators are connected to the first shield conductor and respective second end portions of the plurality of resonators are spaced apart from the second shield conductor; and
the input terminal and the output terminal are capacitively coupled to the resonant circuit.

2. The filter device according to claim 1, wherein surfaces of the input terminal and the output terminal are covered with a metal having corrosion resistance.

3. The filter device according to claim 2, wherein the metal is Au or Sn.

4. The filter device according to claim 2, wherein the metal is an electrolytically plated metal.

5. The filter device according to claim 1, further comprising capacitor electrodes that face the corresponding second end portions of the plurality of resonators and that are connected to the second shield conductor.

6. The filter device according to claim 5, wherein each of the capacitor electrodes includes multiple conductors that at least partially protrude from one of the plurality of resonators to an adjacent resonator of the plurality of resonators in the second direction.

7. The filter device according to claim 1, wherein a length of each of the plurality of resonators is about λ/4, where λ represents a wavelength of a transmitted radio-frequency signal.

8. The filter device according to claim 1, wherein the plurality of resonators are a distributed-constant TEM mode resonator.

9. The filter device according to claim 1, wherein the plurality of resonators are magnetically coupled with each other.

10. The filter device according to claim 1, wherein the filter device is a bandpass filter.

11. A radio-frequency front-end circuit comprising the filter device according to claim 1.

12. A communication device comprising the radio-frequency front-end circuit according to claim 11.

13. The communication device according to claim 12, wherein the communication device is a mobile terminal.

14. The communication device according to claim 12, further comprising:
an antenna;
a mixer;

a local oscillator;

a digital/analog converter, and an RF circuit.

15. The radio-frequency front-end circuit according to claim 11, further comprising:

bandpass filters;

an amplifier; and an attenuator.

16. The radio-frequency front-end circuit according to claim 15, wherein each of the bandpass filters includes:

an input terminal;

an output terminal;

a grounding terminal;

a resonant circuit including at least one resonator;

a first inductor to connect the input terminal and the grounding terminal; and a second inductor to connect the output terminal and the grounding terminal; wherein the input terminal and the output terminal are capacitively coupled to the resonant circuit.

17. The radio-frequency front-end circuit according to claim 11, further comprising:

a transmission circuit to transmit a radio-frequency signal or a reception circuit to receive a radio-frequency signal.

18. The filter device according to claim 1, wherein each of the plurality of resonators extends in the first direction and includes a plurality of conductors laminated in the lamination direction.

19. The filter device according to claim 18, further comprising, in each of the plurality of resonators, a connection conductor on a side where the second end portion is located to electrically connect the plurality of conductors.

* * * * *